United States Patent

[11] 3,599,104

[72] Inventors William Peil
North Syracuse, N.Y.;
Friedrich Szuran, Zug, Switzerland

[21] Appl. No. 787,832
[22] Filed Dec. 30, 1968
[45] Patented Aug. 10, 1971
[73] Assignee General Electric Company

[54] LOGARITHMIC AMPLIFIER OF EXTENDED DYNAMIC RANGE
9 Claims, 7 Drawing Figs.

[52] U.S. Cl. .......... 328/145, 307/229
[51] Int. Cl. .......... H04b 1/04
[50] Field of Search .......... 328/145; 330/103; 307/229; 343/16

[56] References Cited

UNITED STATES PATENTS 3,374,361 3/1968 Callis .......... 328/145 X
3,483,475 12/1969 Mitchell .......... 328/145

OTHER REFERENCES

" A New Type Instantaneous Logarithmic Wide-Band Amplifier," distributed by Office of Technical Services, U.S. Dept. of Comm PB121485, Bureau of Ships Translation 592, May 1955, 13 pages copy in 328/145

*Primary Examiner*—Donald D. Forrer
*Assistant Examiner*—B. P. Davis
*Attorneys*—Richard V. Lang, Marvin A. Goldenberg, Frank L. Neuhauser, Oscar B. Waddell and Melvin M. Goldenberg

ABSTRACT: Apparatus is disclosed for logging an input signal over an extended dynamic range. The apparatus has particular application to high frequency, high bandwidth signals. An extended logarithmic range is achieved by using consecutive logarithmic stages, wherein each stage exhibits a linear portion and a logarithmic portion in its transfer characteristic. Each stage is so arranged that successive portions of the dynamic range of the input signal is successively logged. Thus an output signal is generated wherein an extended dynamic range of the input signal is continuously logged. The logging component comprises a semiconductor diode preferably in a symmetrical diode pair configuration.

INVENTORS:
WILLIAM PEIL,
FRIEDRICH SZURAN,

BY Richard V. Lang

THEIR ATTORNEY.

INVENTORS:
WILLIAM PEIL,
FRIEDRICH SZURAN,
BY Richard V. Lang
THEIR ATTORNEY.

INVENTORS:
WILLIAM PEIL,
FRIEDRICH SZURAN,
BY Richard V. Lang
THEIR ATTORNEY.

LOGARITHMIC AMPLIFIER OF EXTENDED DYNAMIC RANGE

The invention herein described was made in the course of a contract or subcontract thereunder with the department of the army.

BACKGROUND OF THE INVENTION

1. Field of the Invention

The invention relates to logarithmic amplifiers and more particularly to logarithmic amplifiers for use at high frequencies and having an extended dynamic range.

2. Description of the Prior Art

The use of semiconductors diodes for use in logging intermediate frequency signals is known as is the use of symmetrical diode pairs in such applications. In the prior art where multiple diodes are employed, successive stages have ordinarily been used to increase the compression ratio of the amplifier. In such circuits, the dynamic range of the signal is ordinarily restricted to the dynamic input range capability of the first logarithmic stage. Accurate logging for signals at frequencies so high that the parasitic reactances of the diodes per se and stray circuit reactances interfere with the logging process is particularly difficult and the present invention is directed to a solution of that problem.

SUMMARY OF THE INVENTION

It is accordingly an object of the present invention to provide an improved logarithmic amplifier.

It is an additional object of the present invention to provide a novel logarithmic amplifier having extended dynamic range.

It is a further object of the invention to provide an improved logarithmic amplifier for use with high-frequency high bandwidth signals having an extended dynamic logging range.

It is still another object of the invention to provide an improved logarithmic amplifier for use with high frequency and high bandwidth signals utilizing semiconductor diodes for performing the logging process wherein novel means are employed to compensate for the adverse affects of parasitic reactances in the devices themselves and stray reactances in the associated circuits so as to achieve an extended dynamic logging range of high logging accuracy.

These and other objects of the invention may be achieved in accordance with the invention in a novel logarithmic amplifier consisting of typically two successive logarithmic stages; the first having essentially a linear-logarithmic transfer characteristic for logging an upper portion of the dynamic range of an input signal, followed by a second logarithmic stage exhibiting a logarithmic-linear transfer characteristic for logging the lower portion of the dynamic range. The combination thus provides logging over an extended portion of the dynamic range of the input signal by tacking two consecutively logged portions. If a more extended dynamic range is sought, additional stages may be added.

In accordance with a further aspect of the invention, particularly in application to high-frequency, wide bandwidth signals, a symmetrical diode configuration is disclosed wherein the input circuit and the output circuit have special provisions for achieving logarithmic operation in the face of the parasitic reactances in the diodes and stray reactances in the associated circuitry. Such provisions include the use of additional resistive impedances to linearize the linear portions of the transfer characteristic of the logarithmic stages and to render them less frequency dependent upon these accidental reactances. In addition, a novel output circuit is described having a novel delay line, low pass filter circuit which has the electrical effect of absorbing stray shunt capacitive reactance while avoiding the inductive shunting effects of a band-pass circuit. Thus is presenting an essentially resistive load to the diodes broad band, wide dynamic range signals are accurately and uniformly logged.

BRIEF DESCRIPTION OF THE DRAWING

The novel and distinctive features of the invention are set forth in the claims appended in the present application. The invention itself, however, together with the further objects and advantages thereof may best be understood by reference to the following description and accompanying drawings, in which:

DESCRIPTION OF THE PREFERRED EMBODIMENT

Figure 1:
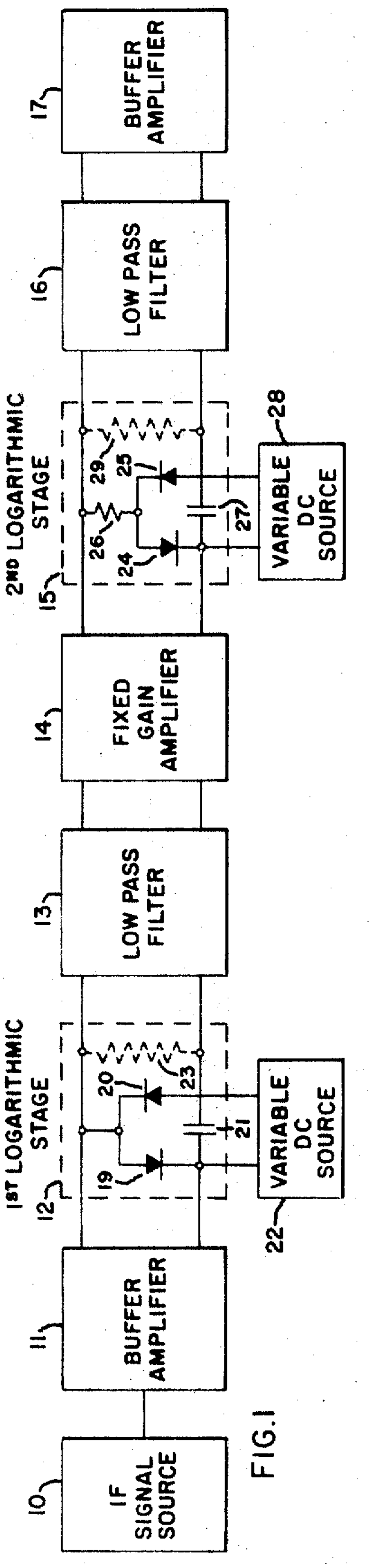
FIG. 1 is a block diagram of an embodiment of the invention having two stages of logging.
Figure 2:
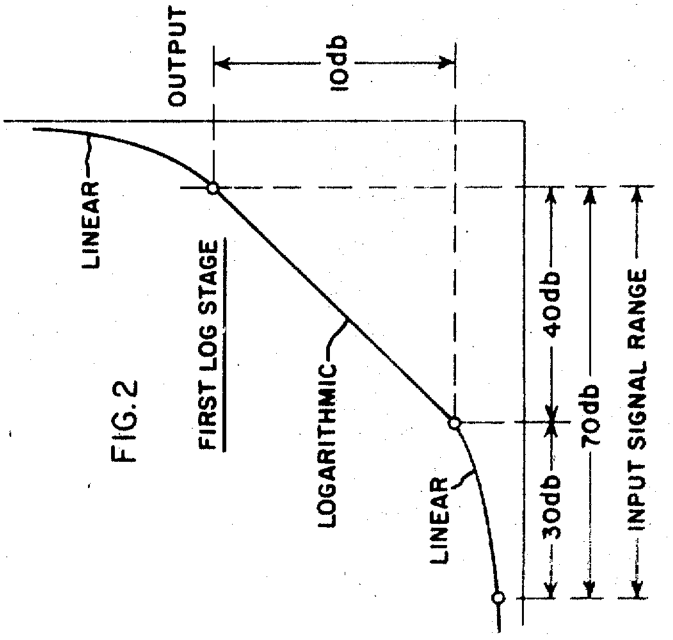
FIG. 2 is a graph illustrating the logging characteristic of the first logarithmic stage of the invention.
Figure 3:
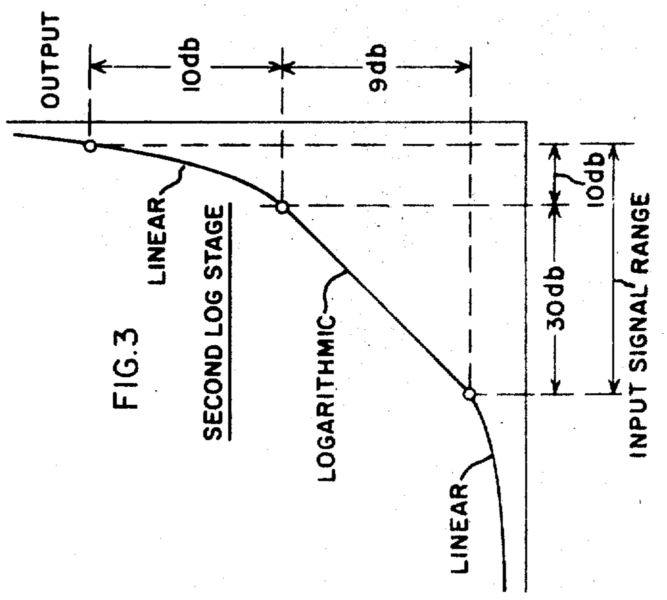
FIG. 3 is a graph illustrating the logarithmic characteristic of a second logarithmic stage.

Referring now to FIG. 1, an intermediate frequency logarithmic amplifier having two logarithmic stages is shown. It has as its principal components a source 10 of intermediate frequency signals, an input buffer amplifier 11, a first logarithmic stage 12, a low pass filter 13, a fixed gain amplifier 14, a second logarithmic stage 15, a low pass filter 16, and an output buffer amplifier 17. Each of these components is connected in sequence in the order recited. In passage through these components, the intermediate frequency signal is converted from an input signal varying through a 70 decibel dynamic range to an output signal compressed by an accurate logarithmic rule to an 18-decibel dynamic range. This embodiment may be used in applications where the input signal has a carrier frequency of typically 75 megacycles and a relative bandwidth of 50 percent. In accordance with the invention, the large logarithmic range of compression at this high frequency is achieved in two logging stages. In the first logarithmic stage 12, the upper dynamic range portion of the input signal is logged over an input range of typically 40 decibels while the lower dynamic range portion of the signal is treated linearly. This is as illustrated in FIG. 2. In the second logarithmic stage 15, the upper portion of the input signal, which has been previously logged in the first stage, is passed through linearly while the adjacent lower portion of the input signal (over a dynamic range of 30 decibels) is logged for the first time as illustrated in FIG. 3. Thus, at the output of buffer amplifier 17 an input signal whose dynamic range varies through 70 decibels is compressed to 18 decibels of dynamic range.

The use of the first stage 12 as a linear-logarithmic component, while the second stage 15 is used as a logarithmic-linear component, places different constraints on the two stages. The lower linear region of the first stage must be critically controlled for linearity and the predetermined current level at which the transition from linear to logarithmic operation occurs must be established at a predetermined current level. Similarly, the second stage requires critical control of the upper linear region for linearity and to establish the predetermined current level at which the transition from logarithmic to linear operation occurs. The intervening amplifier stage 14 must also have a carefully established gain so as to insert the partially logged signal at the correct signal level in the second logarithmic stage to begin logging at the point where logging was discontinued in the first stage.

The first logarithmic stage 12 exhibiting the linear-logarithmic characteristic is shown in simplified circuit form in FIG. 1. Its input and output terminals are balanced and a balanced signal connection is made to the shunt-connected diode pair 19, 20 which logs both positive and negative polarity cycles. The first diode 19 is shown having its anode connected to the upper input and output terminals and its cathode connected to the lower input terminal. The second diode 20 has its cathode connected to the anode of diode 19 and its anode connected to the lower output terminal. The cathode of diode 19 and anode of diode 20 are connected together through a capacitor 21 of low impedance at all signal frequencies. A variable DC source 22 is connected in shunt with said capacitor 21. It establishes the desired forward bias setting of approximately one-half volt across each diode 19 and 20 for optimal logging and any departure from this setting may be used as a control on the compression ration—the ratio between input signal dynamic range in db. to output signal dynamic range in db. This ratio may be increased by decreasing the bias and vice versa. The compression ratio selected depends primarily upon application.

The output loading applied to the diode pair 19, 20 is symbolized by the dotted resistance 23, shunting the output terminal of the first logarithmic stage 12. This loading 23, while desirably primarily resistive, is also made up of a composite of the load presented to the "ideal diode," including parasitic constituents of the diodes 19 and 20 themselves, the effect of the low pass filter 13, and the reflected input load of fixed gain amplifier 14. For high frequency and wideband operation the loading 23 is made primarily resistive and independent of stray reactive components, as by the use of a highly conductive load element or by suitable compensation of the output circuit.

The value selected for 23 establishes the transition point (e.g., the current level) between the lower linear region and the central logarithmic region of the diode transfer characteristic.

The second logarithmic stage 15 exhibiting the logarithmic-linear characteristic is also shown in simplified circuit form in FIG. 1. As in the first logarithmic stage 12, its input and output terminals are balanced and it includes a diode pair 24, 25, also shunt connected across the signal paths. The anode of diode 24 and cathode of diode 25 are connected together and through a resistance 26 to the upper input and output terminals. The other connections are as in the first logarithmic stage and include a capacitor 27 interconnecting the diode terminals in the lower signal path 27 interconnecting the diode terminals in the lower signal path and a variable DC source 28 for applying a suitable forward bias to the diodes 24, 25. The sources 22 and 28 are preferably independent of one another to permit independent adjustment of the compression ratios of the two logarithmic stages. While ordinarily one may seek equal compressions in both ranges to achieve a smooth overall logarithmic characteristic, in certain application a different compression setting for the two logarithmic stages may be to advantage.

The output loading to the second logarithmic stage is symbolized by the dotted resistance 29. Its selection is usually made to correspond to the considerations used in the selection of diode loading 23. Since the effect of the loading 29 is primarily upon the lower portion of the second stage input characteristic, at signal levels below the assumed 70 db. of useful signal range, its selection is not so critical in the operation of the second stage as the loading for the first logarithmic stage. For convenience in design, however, the two are usually the same. If a third stage of logging is added so that the second stage is no longer the final logging stage, then control of the lower linear characteristic of the second logging stage would be required. If a third logging stage is added, a comparable input signal having a dynamic range of 95 db. may be logged.

The series connected resistor 26 is critical to the operation of the second logarithmic stage since its value establishes the transition point (e.g., the current level) between the upper linear region and the central logarithmic region of the diode transfer characteristic. For high frequency and wideband operation, it is particularly desirable that the resistance 16 dominate the incidental resistive and reactive components and particularly the lead inductance in the individual diodes.

Figure 4A:
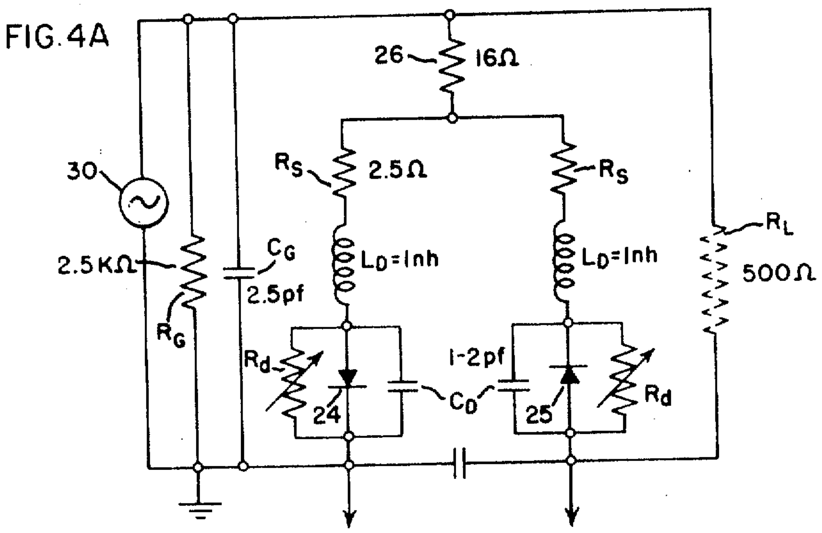
FIGS. 4A, B, and C are equivalent circuit diagrams representing the parasitic reactances of the diode stages and compensatory features which affect logarithmic operation at high frequencies and wide bandwidths.
Figure 4B:
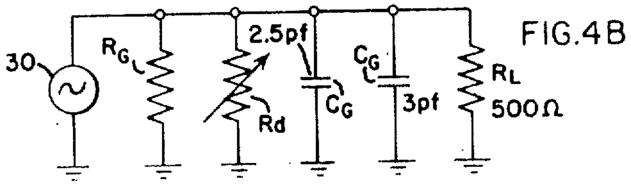
FIG. 4D is a graph comparing the effect of an RC low pass filter with a delay line low pass filter.
Figure 4C:
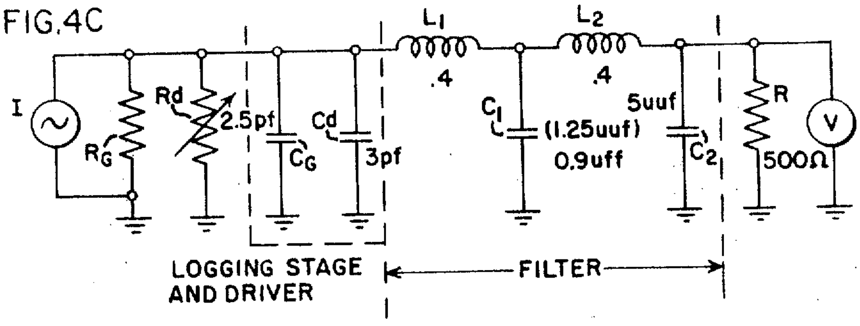

The underlying mechanism by which the transitions from linear to logarithmic and from logarithmic to linear operation are controlled can best be understood by reference to FIGS. 4A, 4B, and 4C. FIG. 4A is an equivalent circuit representation of the symmetrical diode pair employed in the second logarithmic stage 15 with input and output loads symbolized. The diode 24 exhibits a series bulk resistance $R_s$, a series lead inductance $L_d$, a shunt capacity $C_d$, and the dynamic diode logging resistance $R_d$. The ideal diode is symbolized at 24 but since its active component $R_d$ is already present in the circuit, its presence may be regarded as redundant in actual circuit analysis. It does, however, connote the polarity of the diode and its unidirectional nature. Both diodes 24 and 25 are similarly represented. The resistance 26 used to control the upper transition is illustrated as in FIG. 1. The input driving connections comprise an ideal generator 30 having a load resistance $R_g$ and a capacity $C_g$. The output load is illustrated by $R_L$. Typical values for these elements have been indicated in the drawing in order to give some intuitive indication of their affect upon the circuit properties.

The dynamic diode logging resistance $R_d$ is the central parameter effecting logarithmic conversion. Assuming a DC signal with a dynamic range of from 10 microamperes to 10 milliamperes the typical dynamic diode logging resistance varies from 5,000 ohms (at 10 microamperes) to 5 ohms (at 10 milliamperes).

In order to convert this logging resistance $R_d$ into a logged electrical quantity, the diode is ideally driven by a current source—a source whose internal resistance is always greatly in excess of the maximum diode logging resistance and the output quantity is the ideal voltage drop produced in the logging diode by virtue of this changing dynamic resistance.

If the current source has an internal resistance of 10 times the dynamic resistance of the diode at a given point in its operating characteristic, then at this point the current applied to the diode departs 10 percent from the ideal "constant current" value and a 10 percent error occurs. Since the diode dynamic resistance increases as one reaches the low end of the current range, a less-than-infinite source impedance contributes to setting the lowest point at which accurate logging can be performed. A lower point of transition from a logarithmic to a linear characteristic is a limitation of any practical DC circuit.

A second limitation of any practical DC circuit, also affecting the lower transition point, occurs in deriving the "ideal" voltage drop in the logging diode. Preferably, this voltage is derived by a high impedance load connected in shunt with the diode. If this load is large relative to the dynamic resistance of the diode, negligible current will be diverted from the "constant current" applied to the diode. However, it is not practical to make the load resistance infinite and when it approaches the same value as the dynamic resistance of the diode, a departure from the ideal logarithmic voltage drop will occur in proportion to the current diversion in the load which follows a linear dynamic.

A third and final factor affecting the lower logging limit is the diode saturation current. In practical arrangements, the limitations in the maximum source and load resistances of the working circuit often set the lower limits of the logging range well before the saturation current of the diode destroys the intrinsic logging characteristic. This is particularly true of silicon diodes.

The upper logging limit in practical DC operation is usually set by an internal parameter of the diode—its bulk resistance. The diode bulk resistance is ordinarily of a few ohms and will begin to introduce an undesired linear component into the diode output characteristic when the dynamic load resistance of the diode is of a comparable value. This ordinarily occurs in the region of from 5 to 30 milliamperes for high-frequency devices. At DC or low frequency, power diodes exhibit this property into the multiampere range.

In view of the gradual transition both at the lower limit and upper limit of the logarithmic characteristic to a linear characteristic, one may regard these transitions as occuring at the point where the linear component and logarithmic components contribute equally. In practical DC circuits, in spite of the foregoing limitations intrinsic to the diodes themselves and to limitations in the practical operating circuits, accurate logging ranges of 70 to 80 decibels are readily achieved.

In high frequency logging applications, however, this logging range is greatly reduced. This is due to the reactive components of the diode and external circuitry, which are generally illustrated in FIG. 4C. At high frequencies, for instance at 75 megacycles, the lower limits of logarithmic operation are determined by the diode junction capacity, typically one or two picofarads per diode, and the load capacity from driving transistors, which is typically of 2 or 3 picofarads. At these frequencies the corresponding reactances are on the order of 1,000 ohms. Thus, when the dynamic logging resistance $R_d$ attains a comparable value, typically in the region of 100 microamperes, one reaches a capacity determined lower logging limit.

While the stray capacities curtail the lower limit of the logging range the upper limit is restricted by the diode series impedances and stray lead inductances. The diode series impedance comprises the bulk resistance $R_s$, which has been previously discussed, and the series lead inductance $L_s$. The diode lead inductance is typically 1 nanohenry, having a corresponding reactance of approximately one-half ohm at 75 megacycles. Necessary lead inductances, however, required to connect the diodes together and into the circuit usually increase this reactance by several times. The bulk resistance $R_s$ on the other hand is typically 2 to 5 ohms. For DC and low frequency operation the bulk resistance sets the upper logging limit and the affect of the lead inductance is negligible. If, however, high-frequency operation is contemplated, as for instance in the region of 75 megacycles or higher, the stray inductances are usually comparable to the bulk resistance and the two jointly restrict the upper limit of accurate logging. Inaccuracy arises from the higher order harmonics generated in the nonlinear logging diodes, i.e., $3f$, $5f$, etc., if these are not also resistively dominated.

Furthermore, capacitive and inductive strays, some of which are random and some of which are condition dependent, limit accuracy in the control of both limits of the logging region and the boundary linear regions. In wideband operation, any substantial reactive component will lead to an undesirable frequency dependence in the output voltage characteristic.

As shown in FIG. 1, a solution to the requirement for a large and accurate dynamic logging range is to use two (or more) successive logarithmic stages, each logging the input signal through a restricted dynamic range of the input signal, with the two ranges being set adjacent so as to achieve a continuous logarithmic characteristic.

Operation of the first logarithmic stage may be explained in greater detail with reference to FIGS. 2 and 4A to 4D. The equivalent circuit representation of FIG. 4A illustrates the essential reactive strays in a normal high frequency application of the second stage. By removal of the resistance 26 which is not present in the first stage, FIG. 4A accurately represents the first stage. In considering operation of the first stage, FIG. 4A may be further simplified to the form shown in FIG. 4B, for investigation of the lower linear region, the lower transition point and the central logarithmic region. Assuming that the input signal is confined to a range involving only the lower linear and logarithmic range, the series elements attributable to lead inductance and bulk resistance are outweighed by large $R_d$ values, also in series, and thus may be ignored. For simplicity, FIG. 4B treats the circuit as if one diode's parasitics might be considered at a time (or optionally both combined into one). The circuit consists of the source 30, source impedance $R_g$, the diode logging resistance $R_d$, the source capacitance $C_g$, the diode capacity $C_d$ and the load $R_L$. Since the load $R_L$ is in shunt with the capacitive quantities $C_g$ and $C_d$ it may be appreciated that to minimize the distorting effect of the capacity, the load should be selected so that the resistive component will predominate over the reactive component. At 6 picofarads, the stray capacities correspond to about 800 ohms at 75 megacycles. Thus the resistivity of the load should be reduced to a correspondingly smaller value. Reducing the resistivity of the load causes a corresponding reduction in the lower limits of logging or conversely raises the transition from linear to logarithmic operation.

Figure 4D:
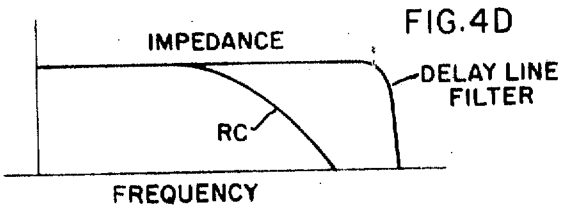

In considering the frequency response of the circuit, it may be seen that the load applied to the ideal diode is a low pass RC network whose low pass transfer characteristic is of the general nature illustrated in FIG. 4D. The curve exhibits a rather prolonged curvature to any components at frequencies in the region of cutoff. If logarithmic operation with a wideband signal is sought, special measures may be required to stay within the linear region of the transfer characteristic. Frequency linearity thus usually forces a further restriction on the logging range.

A low pass filter is to be preferred over a band-pass filter in deriving an output from the logarithmic diodes. While a band-pass filter of suitable bandwidth can be used to faithfully transfer a signal applied to a linear circuit, the nonlinear logarithmic process inherently creates a wide range of subharmonic and harmonic frequency components extending down toward DC and out to infinity. Thus, a band-pass filter would exhibit the customary inductive reactance to subharmonic components (those below a central frequency) and a capacitive reactance to higher harmonic components. The DC energy content of any AC component assuming intermittence in the signal transmission periods or transient condition, falls rapidly as the frequency of the AC component rises, and rises as the frequency of the AC component falls. Accordingly, the net effect of a tuned circuit upon all such components is to create a simulative inductive reactance storing energy primarily from the subharmonic components and periodically introducing a DC offset into the operating point of the diodes. If no reactance is present to store these transients as by use of a low pass filter in lieu of a tuned circuit, the load circuit exhibits a resistive nature to the driving logarithmic diode and the DC component dissipates without enhancement or frequency dependent distortion.

Substantial enhancement of the logging range may be achieved in accordance with a preferred form of the invention, if a low pass filter is provided using reactive elements which compensate for or absorb the capacitive reactance and present an essentially resistive termination to the ideal diode over a wide frequency range.

An equivalent circuit representation of such an approach is illustrated in FIG. 4C. Here all components are as in FIG. 4B save for the addition of two LC filter sections, the first section comprising a series inductance $L_1$ and shunt capacity $C_1$, and a second section consisting of a series inductance $L_2$ and shunt capacity $C_2$. Suitable circuit values for these components are indicated in FIG. 4C. The performance of the artificial delay line, low pass filter enhances the wideband operation of the circuit, generally as illustrated in FIG. 4D. As illustrated, the transfer characteristic holds flat throughout a wider frequency range than with the simple RC network and the resistive quality of the load also retains an almost purely resistive quality until very close to cutoff. This ordinarily permits a higher load resistance for the delay line configuration and a wider logging range.

A practical limitation in the design of the delay line configuration of 4C arises from the variable nature of the dynamic logging resistance $R_d$. Ordinarily this consideration dictates a reduction in the value of the capacitor $C_1$ below the customary design value, established to provide a cutoff at the upper limits of the applied signal, and this departure introduces some perturbation of the overall transfer characteristic. The improvement from the use of a delay line reactive termination over a simple RC network, however, is substantial. Since a longer logarithmic range may be achieved, it is ordinarily to be preferred.

Operation of the second logarithmic stage is complementary to that of the first stage in that the signal applied to the second stage shares the logarithmic region of the second stage but utilizes the upper linear characteristic rather than the lower linear characteristic. At the second stage, a large portion of the signal, usually about half, has been compressed and this compressed portion must be treated linearly in the second stage (as illustrated in FIG. 3). Because the total dynamic range of the input signal is restricted to the central and upper portions of the operating characteristic, an explanatory equivalent circuit for high-frequency signals of large bandwidth may generally omit the capacitive reactances altogether. This is because the dynamic resistance $R_d$ falls to such low values that the capacitive reactances, $C_d$ for instance, are practically infinite. The equivalent circuit then becomes one in which the series elements $R_s$ and $L_s$ predominate as previously asserted.

To make this upper region linear and independent of frequency a linearizing resistance 24 is introduced. It is ordinarily chosen to substantially exceed the reactance attributable to the lead inductances, and its introduction reduces the upper limit of the logging range by about 10 db. in the practical example under consideration. Combined with the logging range achieved in the first stage, a larger total range may be logged in a two-stage configuration than in a single-stage configuration—perhaps 70 versus 40 or 50 db. Assuming similar requirements as to frequency, bandwidth and accuracy, a third logarithmic stage may extend the logging range by another substantial segment—typically 22 db.

Figure 5:
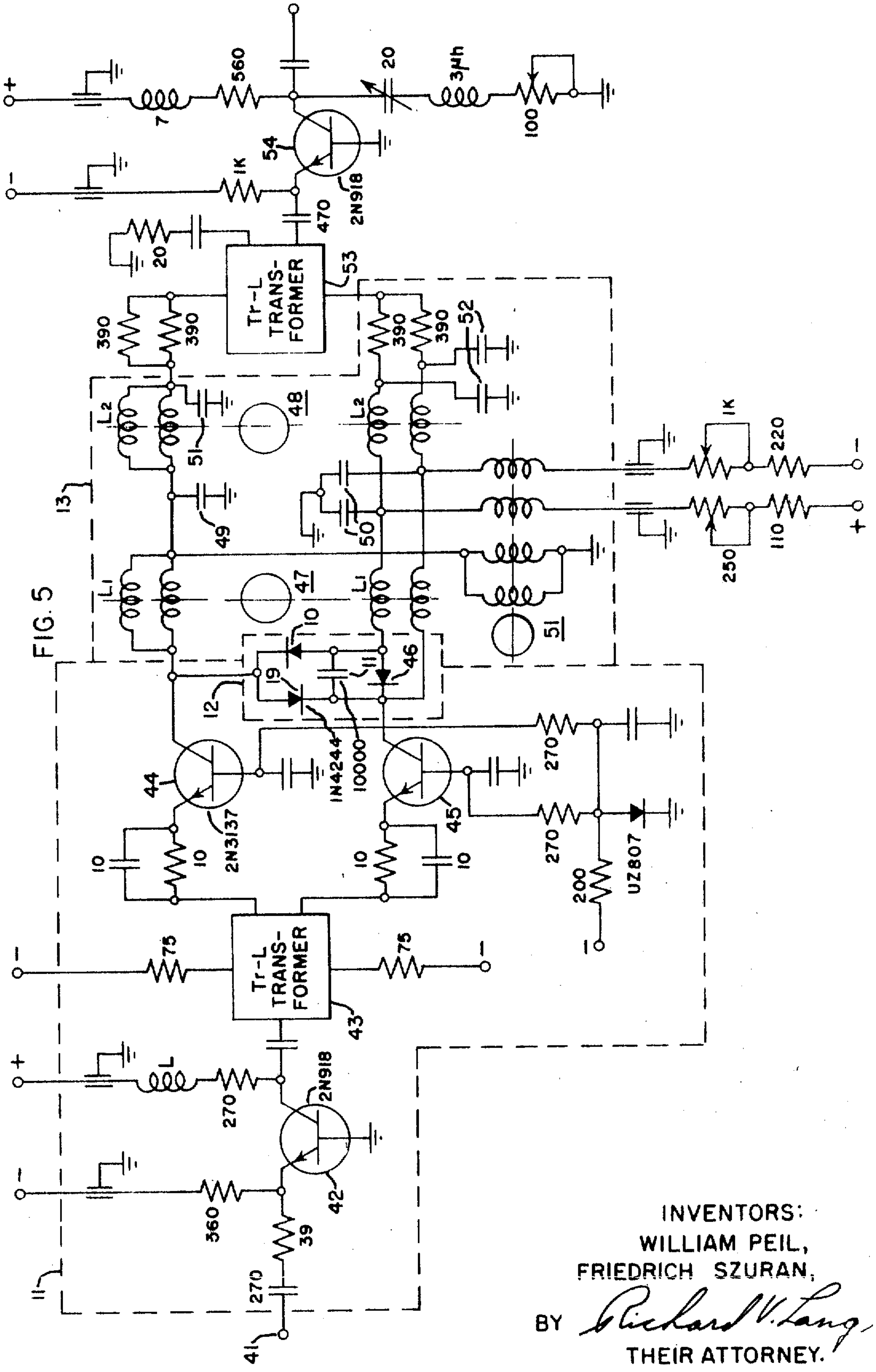
FIG. 5 is a detailed schematic circuit diagram of a portion of the first embodiment, including a logarithmic stage and suitable input and output circuitry.

A detailed circuit diagram of a portion of the first embodiment of the invention is illustrated in FIG. 5. The arrangement in FIG. 5 shows parts of three blocks illustrated in FIG. 1: the buffer amplifier 11, the logarithmic 12 stage, a low pass filter 13, and part of the amplifier 14.

The source of intermediate frequency signals is applied to a logarithmic amplifier at the input terminal 41. The terminal 41 is connected to the buffer amplifier 11, which comprises an input transistor 42 and a pair of output transistors 44, 45 connected in push-pull. The input transistor 42 is connected in conventional common base configuration and suitable energization connections are made to emitter and collector electrodes. The output from the transistor 42 is capacitively coupled to the transmission line transformer 43, which converts the single-ended output from transistor 42 to a balanced configuration suitable for driving the output transistors 44 and 45. These transistors 44, 45 are also connected in common base configuration with input connections being applied to their emitters and the push-pull output being derived from their collectors. The collectors are then directly applied across the symmetrical diodes 19 and 20 of the first logarithmic stage 12; the cathode of diode 19 and anode of diode 20 being connected directly to the collector of transistor 44 and the cathode of the diode 19 being directly connected to the collector of transistor 45 while the anode of diode 20 is coupled through coupling capacitor 21 to the collector electrode of transistor 45.

The advantage of employing a push-pull drive for the symmetrical diode pair is that it minimizes the capacitive loading due to the driving transistors. Assuming the alternative that a single, single-ended driving transistor were employed and that the symmetrical diode pair was also single ended, then the full output capacity of the driving transistor would be applied across the diode pair. If, however, the diode pair is balanced to ground, and driven by a pair of push-pull transistors (each presumably having no greater capacity than a single-ended driving transistor), then in the conventional design where their output capacity is returned to ground, these output capacities would be combined in series across the diode pair, and their capacity across the diode pair reduced by a factor of two.

The output from the first logarithmic stage 12 is then applied to the low pass filter which comprises the inductor 47, the inductor 48 and the capacitances 49, 50, 51 and 52. In addition, a third inductor 51 is provided which does not enter directly into the low pass filtering characteristic but provides a radio frequency choke for introducing the direct current bias across the diodes 19 and 20.

As illustrated, each of the inductors 47, 48 and 51 includes a single core with which four identical windings are associated, all mutually intercoupled. The lower windings on the inductor 47 are coupled to the separate lower electrodes of the diode pair 19, 20 and form first inductances to two identical low pass filter sections. The lower windings of the inductor 48 are serially connected with these respective lower windings of the inductor 47 and are then connected through a pair of equal valued resistors to the lower input terminal of a second transmission line transformer 53 to form a second set of identical low pass filter sections. The junctions between the lower windings of the inductors 47 and 48 are separately joined to a pair of windings from a third choke inductor 51 to a source of DC bias potentials suitable for driving the diode pair 19, 20.

The filter sections formed by the lower pair of windings of the inductors 47, 48 are completed by the capacitances 50 and 52 which are made up of essentially stray capacity. In similar manner the upper pair of windings of the inductor 47 are paired identical windings connected in series with the upper windings of the inductor 48 which are also paired identical windings. These upper windings together with the capacitances 49, 51 form a two-section filter for the upper output lead from a diode pair and are led through parallel resistances to the upper input terminal of the transmission line transformer 53. The transmission line transformer is then used to couple the signal to the input of the amplifier transistor 54.

The reason for a multiplicity of paralleled similar filter sections is the need to make the filter sections identical electrically between the upper and lower current paths. Any electrical asymmetry between these paths will introduce an error into the logging process. Since the operating frequencies are so high that distributed impedances become significant, a similarity in construction in each of the signal paths is required as implied by the schematic circuit diagrams.

The design of the low pass filter in FIG. 5 is substantially as explained in FIG. 4C with the diode shunt capacity ($C_d$) being absorbed into the total delay line and the performance being as indicated in FIG. 4D. Appropriate circuit valves have been marked upon both Figures.

Although the invention has been described primarily with respect to performing a logarithmic operation on intermediate frequency signals it should be evident that the principles may also be applied to wide-band signals having high-frequency components. The invention may also utilize additional logarithmic stages if a more extended logging range is desired or if high-frequency or wide-band width requirements restrict the logging range of individual stages. While silicon semiconductor diodes have been described, other types of diodes may also be employed, including those of other semiconductor materials.

Although the invention has been described with respect to certain embodiments, it should be appreciated that additional modifications and changes may be made by those skilled in the art without departing from the spirit and scope of the invention.

What we claim as new and desire to secure by Letters Patent in the United States is:

1. A logarithmic amplifier comprising:

a. a signal source providing at its output a signal lying within a desired dynamic range;

b. a first logarithmic stage to which the output signal from said source is coupled, having a linear transfer characteristic for lower amplitude elements of the applied signal but which, at a given signal amplitude within said range, has a transition to a logarithmic transfer characteristic for higher amplitude elements; said first logarithmic stage including a first symmetrical semiconductor diode pair to generate said logarithmic characteristic and means shunt loading said first diode pair having a resistive component selected to achieve a lower linear transfer characteristic of sufficient dynamic range to accommodate the lower portion of said desired dynamic range, c. a second logarithmic stage having a logarithmic transfer characteristic for lower amplitude elements of an applied signal but which, at a given signal amplitude, has a transition to a linear transfer characteristic for higher amplitude elements; said second logarithmic stage including a second symmetrical semiconductor diode pair to generate said logarithmic characteristic; and a resistive element connected in series with said second diode pair, having a value selected to achieve an upper linear transfer characteristic of sufficient dynamic range to accommodate the previously logged signal portion, d. an amplifier coupling the output of said first logarithmic stage to the input of said second logarithmic stage for amplifying the signal to a level such that the portion of the signal previously logged in the first stage is applied to the linear portion of the second logarithmic stage transfer characteristic to form from the separately logged ranges a continuous logarithmic transfer characteristic spanning said desired dynamic range.

2. A logarithmic amplifier as set forth in claim 1, especially adapted for logging radio frequency signals; and a. wherein said series resistive element connected in said second logarithmic stage has a value which substantially exceeds the reactive contribution of diode and stray series inductances to achieve an upper linear transfer characteristic independent of said inductances.

3. A logarithmic amplifier as set forth in claim 1, especially adapted for logging radio frequency signals;

a. wherein the resistive component of said shunt-loading means substantially exceeds the reactive contribution of diode and stray shunt reactances to the diode load in order to establish a stable lower linear transfer characteristic throughout said desired dynamic range independent of said reactances; and b. wherein said series resistive element has a value which substantially exceeds the reactive contribution of diode and stray series inductances to make said upper linear transfer characteristic independent of said inductances.

4. A logarithmic amplifier as set forth in claim 3 especially adapted for logging intermediate frequency signals of substantial bandwidth;

a. wherein said loading comprises a low pass filter matching each diode pair to its respective load and passing both the fundamentals of the principal sideband components of the applied signal as well as the subharmonic components produced in the logging process, and presenting an essentially resistive impedance to all said components.

5. A logarithmic amplifier as set forth in claim 4;

a. wherein said low pass filter is an artificial delay line employing reactive components and is dimensioned to absorb the stray capacity associated with said diode pairs.

6. A logarithmic amplifier as set forth in claim 3;

a. wherein said symmetrical diode pairs are provided with balanced input connections; and b. wherein a pair of buffer amplifiers are provided each coupled to one set of balanced input connections, said buffer amplifiers including a pair of transistors whose outputs are balanced so that said stray shunt capacitance contributed by their respective output capacities is halved.

7. A logarithmic amplifier as set forth in claim 1, a. wherein an adjustable DC bias means is provided for the diodes in each diode pair for separate adjustment of the compression ratio of each logarithmic stage.

8. A logarithmic amplifier as set forth in claim 1 especially adapted for logging radio frequency signals; wherein the resistive components of said shunt-loading means substantially exceeds the reactive contribution of diode and stray shunt reactances to the total diode load in order to establish a stable lower linear transfer characteristic throughout said desired dynamic range independent of said reactances.

9. A logarithmic amplifier as set forth in claim 1 especially adapted for logging radio frequency signals; wherein shunt-loading means are provided for each of said diode pairs, each having a resistive component which substantially exceeds the reactive contribution of diode and stray shunt reactances to the total diode load in order to establish a lower linear transfer characteristic throughout said desired dynamic range, independent of said reactances.